(12) United States Patent
Miller et al.

(10) Patent No.: US 11,075,299 B2
(45) Date of Patent: Jul. 27, 2021

(54) TRANSISTOR GATE HAVING TAPERED SEGMENTS POSITIONED ABOVE THE FIN CHANNEL

(71) Applicant: International Business Machines Corporation, Armonk, NY (US)

(72) Inventors: Eric Miller, Watervliet, NY (US); Gauri Karve, Cohoes, NY (US); Marc A. Bergendahl, Rensselaer, NY (US); Fee Li Lie, Albany, NY (US); Kangguo Cheng, Schenectady, NY (US); Sean Teehan, Rensselaer, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 31 days.

(21) Appl. No.: 16/458,708

(22) Filed: Jul. 1, 2019

(65) Prior Publication Data

US 2021/0005749 A1  Jan. 7, 2021

(51) Int. Cl.
| | | |
|---|---|---|
| H01L 29/78 | (2006.01) | |
| H01L 21/28 | (2006.01) | |
| H01L 29/423 | (2006.01) | |
| H01L 29/66 | (2006.01) | |

(52) U.S. Cl.
CPC .... *H01L 29/7856* (2013.01); *H01L 21/28114* (2013.01); *H01L 29/42376* (2013.01); *H01L 29/66545* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 6,661,066 B2 | 12/2003 | Kuroi et al. | |
| 9,111,762 B2 * | 8/2015 | Kim | .............. H01L 29/7827 |
| 9,117,908 B2 | 8/2015 | Xie et al. | |
| 9,356,120 B2 | 5/2016 | Wu et al. | |
| 9,455,344 B2 | 9/2016 | Chuang et al. | |
| 9,685,555 B2 | 6/2017 | Liu et al. | |
| 10,529,862 B2 * | 1/2020 | Liang | .............. H01L 29/66795 |

(Continued)

OTHER PUBLICATIONS

Anonymous, "Capping layer free damascene dummy gate formation for RMG finFET fabrication," IPCOM000235786D, Mar. 2014, 6 pages.

*Primary Examiner* — Michelle Mandala
(74) *Attorney, Agent, or Firm* — Cantor Colburn LLP; Erik Johnson

(57) ABSTRACT

Embodiments of the invention are directed to a method that includes forming a fin over a major surface of a substrate. The fin includes an active fin region having a top fin surface and a fin sidewall. The top fin surface is substantially parallel with respect to the major surface, and the fin sidewall is substantially perpendicular with respect to the major surface. A gate is formed over and around a central portion of the fin, the gate having a bottom gate region and a top gate region. The bottom gate region is substantially below the top fin surface and includes a bottom gate region sidewall that is substantially parallel with respect to the fin sidewall. The top gate region is substantially above the top fin surface and includes a top gate region sidewall that is at an angle with respect to the major surface.

20 Claims, 10 Drawing Sheets

(56) References Cited

U.S. PATENT DOCUMENTS

| | | |
|---|---|---|
| 2008/0150090 A1 | 6/2008 | Lin et al. |
| 2009/0148991 A1* | 6/2009 | Chung .............. H01L 29/66666 |
| | | 438/268 |
| 2013/0140627 A1* | 6/2013 | Masuoka .......... H01L 21/02532 |
| | | 257/329 |
| 2013/0198695 A1 | 8/2013 | Bryant et al. |
| 2018/0219096 A1 | 8/2018 | Cai et al. |
| 2019/0244963 A1* | 8/2019 | Kim .................... H01L 29/0847 |
| 2020/0058565 A1* | 2/2020 | Cheng ............. H01L 21/823814 |
| 2020/0066903 A1* | 2/2020 | Bao .................. H01L 29/66545 |
| 2020/0119163 A1* | 4/2020 | Xie .................. H01L 21/31144 |

* cited by examiner

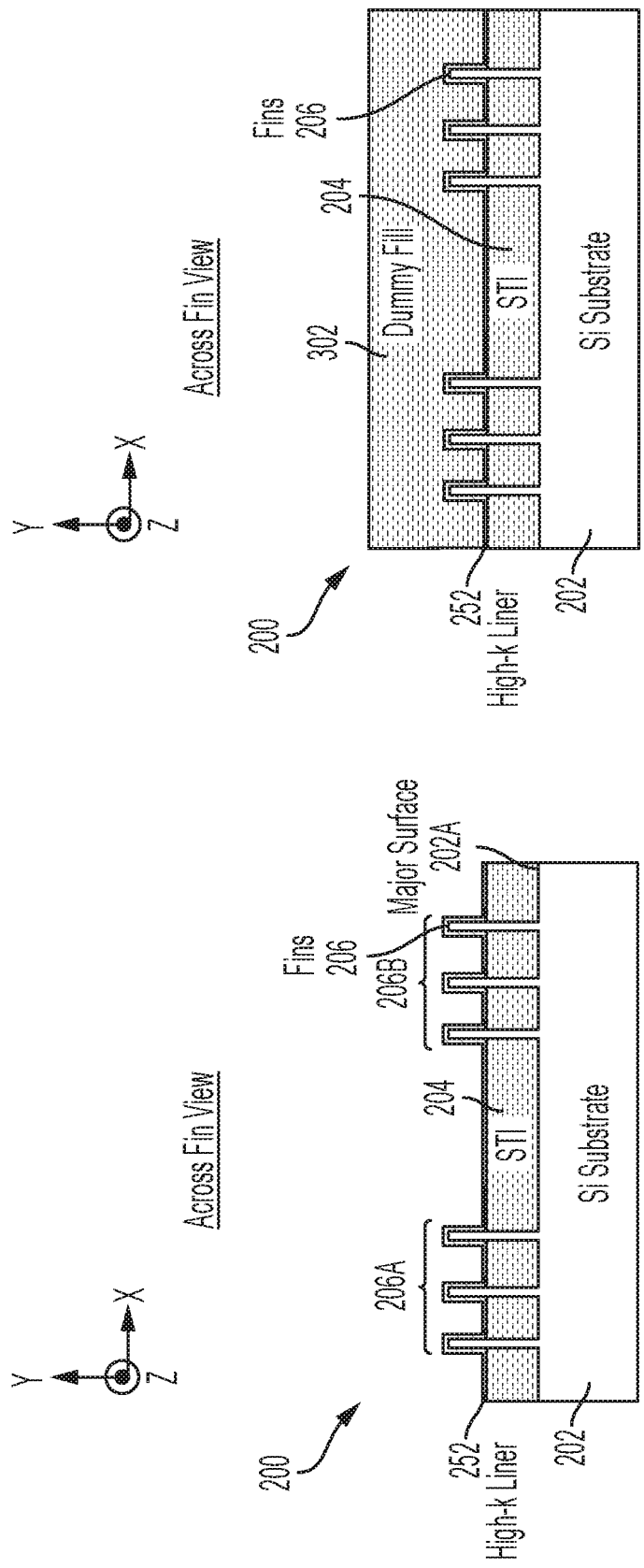

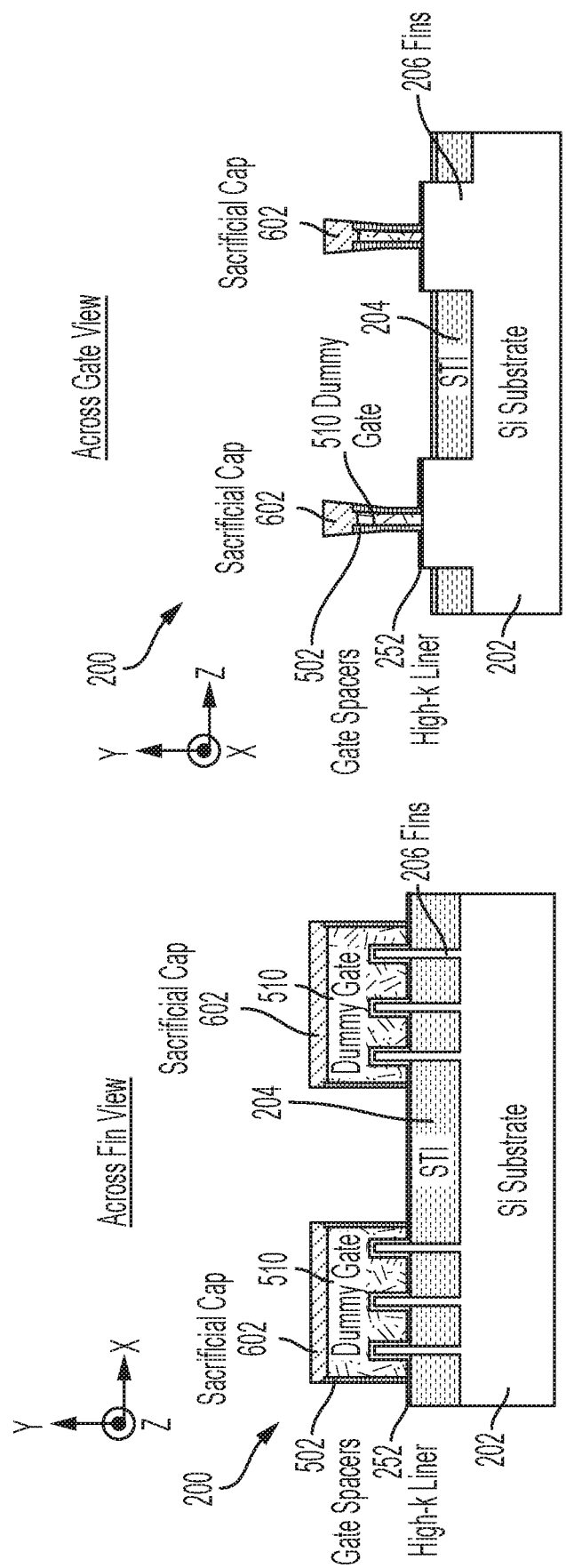

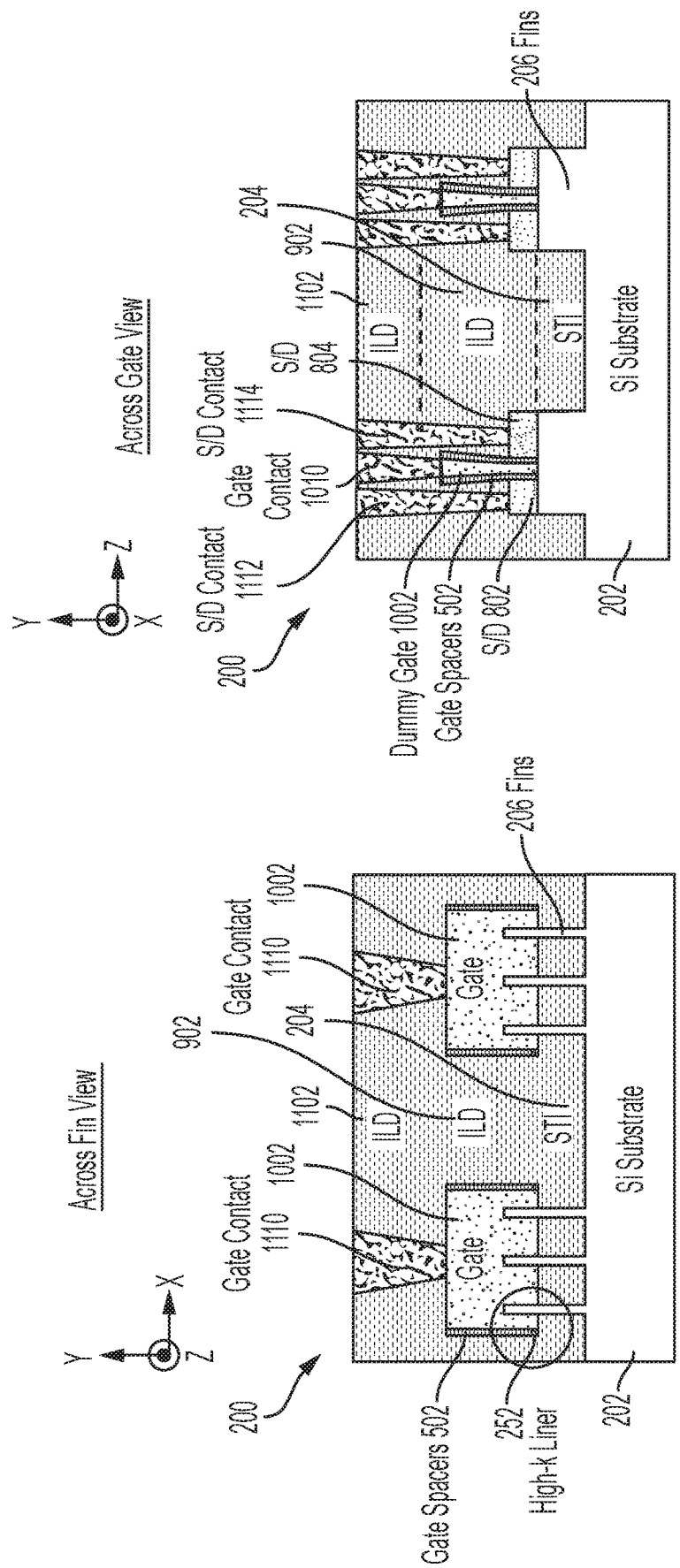

TRANSISTOR GATE HAVING TAPERED SEGMENTS POSITIONED ABOVE THE FIN CHANNEL

BACKGROUND

The present invention relates in general to fabrication methods and resulting structures for semiconductor devices. More specifically, the present invention relates to fabrication methods and resulting structures for a transistor gate having tapered segments that are positioned above the fin channel region of the transistor.

Integrated circuits (ICs) include a plurality of metal oxide semiconductor field effect transistors (MOSFETs), and each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. The channel region connects the source and the drain. Electrical current is induced to flow through the channel region from the source to the drain by a voltage applied at the gate electrode.

MOSFET architectures can be planar or non-planar. In planar MOSFETs, the channel is substantially low aspect-ratio structure that is thin and flat, while in non-planar MOSFETS, the channel is a substantially high aspect-ratio structure that is taller than it is wide. A Fin-type FET (FinFET) is an example of a non-planar device architecture wherein the channel is formed in a high aspect-ratio fin-shaped structure. A gate runs along sidewalls and a top surface of a central portion of the fin, and the central portion of the fin functions as the FinFET channel.

SUMMARY

Embodiments of the invention are directed to a method of forming an integrated circuit (IC) structure. In a non-limiting embodiment of the invention, the method includes forming a fin over a major surface of a substrate. The fin includes an active fin region having a top fin surface and a fin sidewall. The top fin surface is substantially parallel with respect to the major surface of the substrate, and the fin sidewall is substantially perpendicular with respect to the major surface of the substrate. A gate is formed over and around a central portion of the fin, the gate having a bottom gate region and a top gate region. The bottom gate region is substantially below the top fin surface and includes a bottom gate region sidewall that is substantially parallel with respect to the fin sidewall and substantially perpendicular with respect to the major surface of the substrate. The top gate region is substantially above the top fin surface and includes a top gate region sidewall that is substantially non-parallel with respect to the fin sidewall and substantially non-parallel with respect to the major surface of the substrate.

Embodiments of the invention are directed to a method of forming an IC structure. In a non-limiting embodiment of the invention, the method includes forming a fin over a major surface of a substrate. The fin includes an active fin region having a top fin surface and a fin sidewall. The top fin surface is substantially parallel with respect to the major surface of the substrate. The fin sidewall is substantially perpendicular with respect to the major surface of the substrate. A gate is formed over and around a central portion of the fin, the gate having a bottom gate region and a top gate region. The bottom gate region is substantially below the top fin surface and includes bottom gate region sidewalls that are substantially parallel with respect to the fin sidewall and substantially perpendicular with respect to the major surface of the substrate. The top gate region is substantially above the top fin surface.

Embodiments of the invention are directed to an IC structure. In a non-limiting embodiment of the invention, the IC structure includes a fin formed over a major surface of a substrate. The fin includes an active fin region having a top fin surface and a fin sidewall. The top fin surface is substantially parallel with respect to the major surface of the substrate. The fin sidewall is substantially perpendicular with respect to the major surface of the substrate. A gate is formed over and around a central portion of the fin, the gate having a bottom gate region and a top gate region. The bottom gate region is substantially below the top fin surface and includes a bottom gate region sidewall that is substantially parallel with respect to the fin sidewall and substantially perpendicular with respect to the major surface of the substrate. The top gate region is substantially above the top fin surface and includes a top gate region sidewall that is substantially non-parallel with respect to the fin sidewall and substantially non-parallel with respect to the major surface of the substrate.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present invention is particularly pointed out and distinctly claimed in the claims at the conclusion of the specification. The foregoing and other features and advantages are apparent from the following detailed description taken in conjunction with the accompanying drawings in which:

FIGS. 2-11B depict the results of fabrication operations for forming an integrated circuit (IC) structure having a fin-based transistor formed thereon, wherein the fin-based transistor is configured to include a gate having tapered sidewall segments positioned above the transistor's fin in accordance with aspects of the invention, in which:

FIG. 2 depicts a cross-sectional view of a representative section of the IC after initial fabrication operations according to embodiments of the invention;

FIG. 3 depicts a cross-sectional view of the representative section of the IC after fabrication operations according to embodiments of the invention;

FIG. 7A depicts a cross-sectional view of the representative section of the IC after fabrication operations according to embodiments of the invention;

FIG. 7B depicts another cross-sectional view (in perpendicular orientation with respect to the view in FIG. 7A) of the representative section of the IC after the fabrication operations depicted in FIG. 7A;

FIG. 8 depicts a cross-sectional view of the representative section of the IC after fabrication operations according to embodiments of the invention;

FIG. 9A depicts a cross-sectional view of the representative section of the IC after fabrication operations according to embodiments of the invention;

FIG. 9B depicts another cross-sectional view (in perpendicular orientation with respect to the view in FIG. 9A) of the representative section of the IC after the fabrication operations depicted in FIG. 9A;

FIG. 10 depicts a cross-sectional view of the representative section of the IC after fabrication operations according to embodiments of the invention;

FIG. 11A depicts a cross-sectional view of the representative section of the IC after fabrication operations according to embodiments of the invention; and FIG. 11B depicts another cross-sectional view (in perpendicular orientation with respect to the view in FIG. 11A) of the representative section of the IC after the fabrication operations depicted in FIG. 11A.

Figure 1:
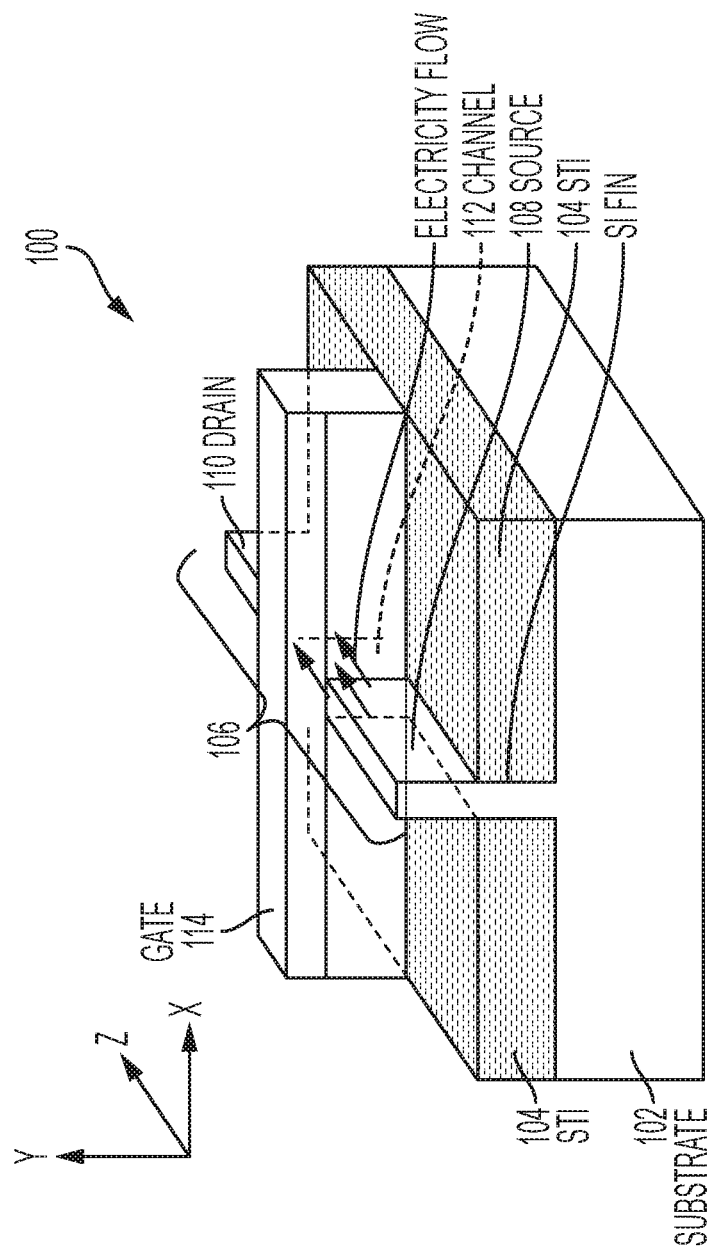
FIG. 1 depicts a three-dimensional view of an example configuration of a FinFET device capable of implementing embodiments of the invention.

In the accompanying figures and following detailed description of the embodiments, the various elements illustrated in the figures are provided with three or four digit reference numbers. The leftmost digit(s) of each reference number corresponds to the figure in which its element is first illustrated.

DETAILED DESCRIPTION

It is understood in advance that, although this detailed description includes a description of the formation and resulting structures for a specific type of gate configuration in a particular type of IC device architecture (i.e., a FinFET), implementation of the teachings recited herein are not limited to a particular type of gate configuration or IC device architecture. Rather, embodiments of the present invention are capable of being implemented in conjunction with any other type of gate configuration or IC device architecture, now known or later developed. For example, embodiments of the invention are capable of being implemented with a nanosheet-based transistor.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, semiconductor devices are used in a variety of electronic and electro-optical applications. ICs are typically formed from various circuit configurations of semiconductor devices (e.g., transistors, capacitors, resistors, etc.) and conductive interconnect layers (known as metallization layers) formed on semiconductor wafers. Alternatively, semiconductor devices can be formed as monolithic devices, e.g., discrete devices. Semiconductor devices and conductive interconnect layers are formed on semiconductor wafers by depositing many types of thin films of material over the semiconductor wafers, patterning the thin films, doping selective regions of the semiconductor wafers, etc.

Typical semiconductor devices are formed using active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the channel body region is a gate electrode. The gate electrode and the channel body are spaced apart by a gate dielectric layer.

With the continued push for reductions in IC component size, non-planar MOSFET architectures have been developed, an example of which is the FinFET device architecture. In a known FinFET architecture, the main body is a fin-shaped structure in which the source, drain, and channel regions are formed. A gate runs along sidewalls and a top surface of a central portion of the fin, and the central portion of the fin functions as the FinFET channel. The end portions of the fin are not under the gate so function as the source region and drain region of the FinFET, respectively.

There are multiple gate-related parameters that impact the performance of non-planar MOSFETs. For example, maintaining gate resistance within a targeted range can improve performance characteristics such as switching speeds. Additionally, the gate length (Lgate) of a MOSFET (i.e., the gate dimension that extends along the channel between source and the drain) can impact important FinFET performance parameters such as threshold voltage, drive current, leakage current, and the like. Further, because the gate contact typically lands on a top surface area of the gate, the surface area of the gate's top surface impacts gate resistance by determining the maximum area of the interface between the gate contact and the gate. Accordingly, it would be desirable to provide a gate structure configured to optimize gate resistance, gate length, and the surface area of the gate top surface.

Turning now to an overview of aspects of the invention, embodiments of the invention provide an improved non-planar fin-based FET structure by providing fabrication methods and resulting structures for a non-planar transistor gate having an upper gate segment positioned above a top surface of the active portion of the transistor fin, along with a lower gate segment positioned below the top surface of the active portion of the active portion of the transistor fin. The upper gate segment includes sidewalls configured to taper outward, and the lower gate segment includes sidewalls that are across from and substantially parallel with sidewalls of the active portion of the fin. Hence, the upper gate segment provides the gate with a tapered gate profile above the fin, and the lower gate segment provides the gate with a "straight" profile below the fin. The straight lower gate segment around fin advantageously ensures uniform gate length, which avoids undesired device characteristics such as increased leakage current. The tapered upper gate segment above the fin provides a gate length (Lgate) dimension (L2, shown in FIG. 10) along a bottom end of the upper gate segment, along with another gate length dimension (L1, shown in FIG. 10) along the top surface of the upper gate segment. Because L1 is greater than L2, Lgate can be maintained while L1 can be increased (e.g., by decreasing the taper angle with respect to the substrate major surface 202A) such that an increased surface area is provided for interfacing the upper gate segment with a gate contact. Increasing L1 while maintaining L2 also has the effect of an increased gate volume for reducing gate resistance. In accordance with aspects of the invention, the point at which the gate region changes from vertical to tapered can be at the fin top or anywhere above it within the gate. The closer to the gate region change is to the fin top surface the larger the increase in L1 (shown in FIG. 10) will be for a given taper angle. In accordance with aspects of the invention, the increase in L1 compared to L2 can be modulated by both the taper angle and vertical starting point of the gate region change. The tapered upper gate segment profile also protects the gate spacers during contact etch because the top of the tapered upper gate segment overhangs the gate spacer near the S/D region, which results in the S/D region not being exposed during etch operations (e.g., a reactive ion etch (RIE)) performed during gate and S/D contact formation.

A non-planar transistor gate can be fabricated in accordance with aspects of the invention by forming fins in a bulk substrate and forming shallow trench isolation (STI) regions between the fins. The portions of the fins that extend above the STI regions define the active regions of the fin. A protective liner (e.g., HfO) is deposited over the STI and the exposed (i.e., active) regions of the fins, and a dummy fill material (e.g., an oxide) is deposited over the protective liner. A precursor gate trench is formed by etching the dummy fill to expose the portions of the protective liner that cover the active regions of the fins, and to expose portion of the protective liner that cover top surfaces of a portion of the STI regions. Thus, the protective liner protects the STI and the fins during the etch operations that form the precursor gate trench.

In accordance with aspects of the invention, a two-step etch is used to form the precursor gate trench to have a profile that substantially mirrors the profile of the non-planar transistor gate. More specifically, a first anisotropic etch is used to form an upper gate trench having tapered upper gate trench sidewalls that substantially mirrors the tapered upper sidewalls of the gate, and a second different etch (which can be anisotropic or isotropic) is used to form a lower gate trench region having lower gate trench sidewalls that are substantially perpendicular with respect to a major surface of the substrate, and that substantially mirror the straight lower sidewalls of the gate. Contrary to known gate fabrication operations in which the gate spacers are formed after forming a dummy gate, embodiments of the invention form the gate spacers on inner sidewalls of the gate trench before the dummy gate (or the final metal gate) is formed. The gate spacers each have a tapered upper gate spacer region and a straight lower gate spacer region that mirror the profiles of the tapered upper gate trench and the straight lower gate trench, respectively. In accordance with aspects of the invention, the upper gate spacer region can include a curved inner sidewall that will define a curved outer sidewall for the tapered upper gate region.

In accordance with aspects of the invention, a dummy gate is formed on exposed surfaces of the gate spacers. The dummy gate is polished/recessed, and a sacrificial gate cap is formed over the dummy gate and the gate spacers, which ensures that the dummy gate is robustly protected by gate spacers and the sacrificial gate cap when the dummy fill and portions of the protective liner are stripped to expose end regions of the fin where S/D regions will be formed. After the S/D regions have been formed, a replacement metal gate (RMG) process is used to replace the dummy gate with a final gate structure (e.g., a high-k metal gate). An additional oxide layer is formed over the structure, and gate contacts and S/D contacts are formed in the additional oxide layer by etching contact trenches in the oxide and forming the gate contacts and the S/D contacts in the trenches. In accordance with aspects of the invention, the tapered upper gate region protects the gate spacers during contact etch as the top portion of the tapered upper gate region overhangs the gate spacers near the S/D regions so the gate spacers are not exposed during contact etch. In aspects of the invention where the upper gate spacer region has been configured to include a curved inner sidewall that defines a curved outer sidewall for the tapered upper gate region, this amount by which the tapered upper gate region overhangs the gate spacers near the S/D regions can be controlled and enhanced by controlling the curvature of the curved outer sidewall of the tapered upper region.

Turning now to a more detailed description of aspects of the present invention, FIG. 1 depicts a three-dimensional view of an example configuration of a FinFET device 100 capable of implementing embodiments of the invention. The basic electrical layout and mode of operation of FinFET 100 do not differ significantly from a traditional FET. FinFET 100 includes a semiconductor substrate 102, an STI layer 104, a fin 106 and a gate 114, configured and arranged as shown. Fin 106 includes a source region 108, a drain region 110 and a channel region 112, wherein gate 114 extends over the top and sides of channel region 112. For ease of illustration, a single fin is shown in FIG. 1. In practice, FinFET devices are fabricated having multiple fins surrounded by STI 104 and on the substrate 102. The substrate 102 can be silicon, the STI region 104 can be an oxide (e.g., silicon oxide), and fin 106 can be silicon. The gate 114 controls the source to drain current flow (labeled ELECTRICITY FLOW in FIG. 1).

In contrast to planar MOSFETs, the source 108, drain 110 and channel 112 regions are built as a three-dimensional bar on top of the STI layer 104 and the semiconductor substrate 102. The three-dimensional bar is the aforementioned "fin 106," which serves as the body of the device. The gate electrode 114 is then wrapped over the top and sides of the fin 106, and the portion of the fin 106 that is under the gate electrode 114 functions as the channel 112. The source and drain regions 108, 110 are the portions of the fin 106 on either side of the channel 112 that are not under the gate electrode 114. The dimensions of the fin 106 establish the effective channel length for the FinFET device 100.

In some FinFET architectures, raised source/drain (S/D) regions (not shown in FIG. 1) can be epitaxially grown over the S/D portions 108, 110 of the fin 106 to increase the S/D volume and provide a larger surface for interfacing S/D conductive contacts (not shown in FIG. 1) with the raised S/D region. The S/D contacts are formed on either side of the gate structure 114, which includes a conductive gate material (e.g., tungsten (W), aluminum (Al), and the like) bound at its lower portion by a dielectric liner (not shown).

FIGS. 2-13 depict a semiconductor structure 200 (e.g., a portion of an IC wafer) after fabrication operations for forming FinFET devices thereon in accordance with aspects of the invention. FIG. 2 depicts a cross-sectional, across-the-fin view of an initial semiconductor structure 200 after initial fabrication stages according to embodiments of the invention. Referring now to FIG. 2, the initial semiconductor structure 200 is fabricated to include a semiconductor substrate 202, fins 206, an STI region 204, and a high-k liner 252, configured and arranged as shown. Known fabrication operations are suitable for forming the semiconductor structure 200 shown in FIG. 2. For example, the substrate 202 can be a bulk semiconductor material, and the fins 206 can be formed in the bulk semiconductor material by depositing a hard mask layer (e.g., SiN) (not shown) over the bulk semiconductor material. A patterned resist (not shown) is deposited over hard mask layer to pattern the fins 206. An etch operation (e.g., an anisotropic etch) is applied to the patterned resist to form the fins 206 in the bulk semiconductor material. The fins 206 are typically formed everywhere on the bulk semiconductor material. The fins 206 that are not needed in the final IC design are removed, resulting in groupings (or sets) 206A, 206B of the fins 206 formed in the substrate 202. The etch operation also forms a major surface 202A of the substrate 202. The substrate 202 can be made of any suitable substrate material, such as, for example, monocrystalline Si, SiGe, SiC, III-V compound semiconductor, II-VI compound semiconductor, or semiconductor-on-insulator (SOI). A local oxide (e.g., $SiO_2$) is deposited between fins 206 and over the major surface 202A of the substrate 202. The local oxide is polished and recessed back to form the STI regions 204, and to expose upper portions (or active regions) of the fins 206. Known fabrication operations (e.g., ALD) are used to deposit a high-k dielectric liner 252 conformally over the STI 204 and the fins 206. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

FIG. 3 depicts a cross-sectional, across-the-fin view of the semiconductor structure 200 after known fabrication operations have been used to deposit and planarize a dummy (or sacrificial) fill material 302 over the structure 200 according to embodiments of the invention. In aspects of the invention, the dummy fill 302 can be any suitable oxide, including, for example, $SiO_2$.

Figure 4B:
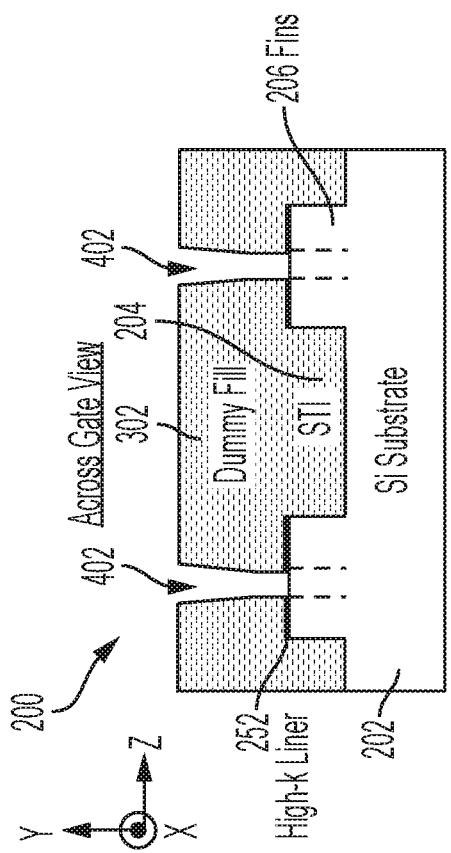
FIG. 4B depicts another cross-sectional view of the representative section of the IC after the fabrication operations depicted in FIG. 4A.
Figure 4C:
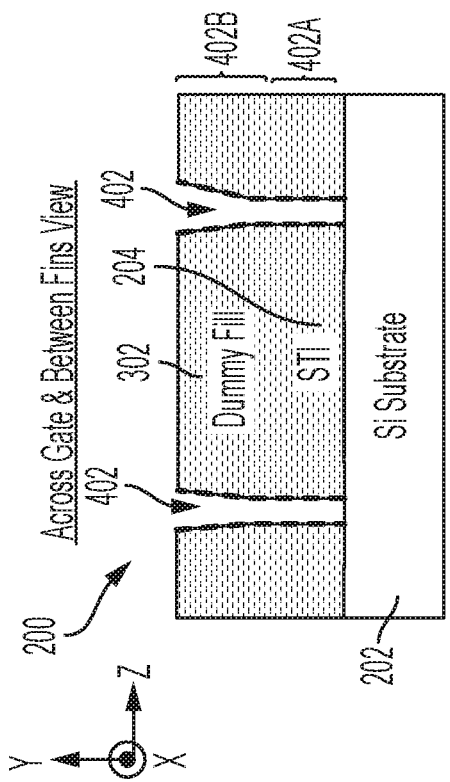
FIG. 4C depicts another cross-sectional view of the representative section of the IC after the fabrication operations depicted in FIG. 4A.
Figure 4A:
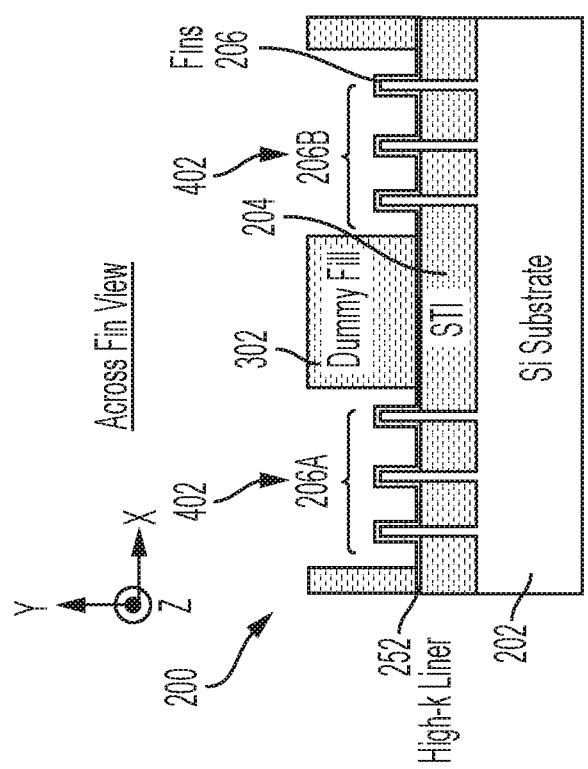
FIG. 4A depicts a cross-sectional view of the representative section of the IC after fabrication operations according to embodiments of the invention.

FIG. 4A depicts a cross-sectional, across-the-fin view of the structure 200 after fabrication operations according to embodiments of the invention. FIG. 4B depicts a cross-sectional, across-the-gate view of the structure 200 depicted in FIG. 4A, and FIG. 4C depicts a cross-sectional, across-the-gate-between-the-fins view of the structure 200 depicted in FIG. 4A. As best shown in FIGS. 4B and 4C, known fabrication operations have been used to pattern and etch the dummy fill 302 to define initial (or precursor) gate trenches 402 and expose portion of the high-k liner 252. In aspects of the invention, the etch operation used to form the gate trenches 402 can be an anisotropic reactive-ion-etch (RIE) process.

Figure 10:
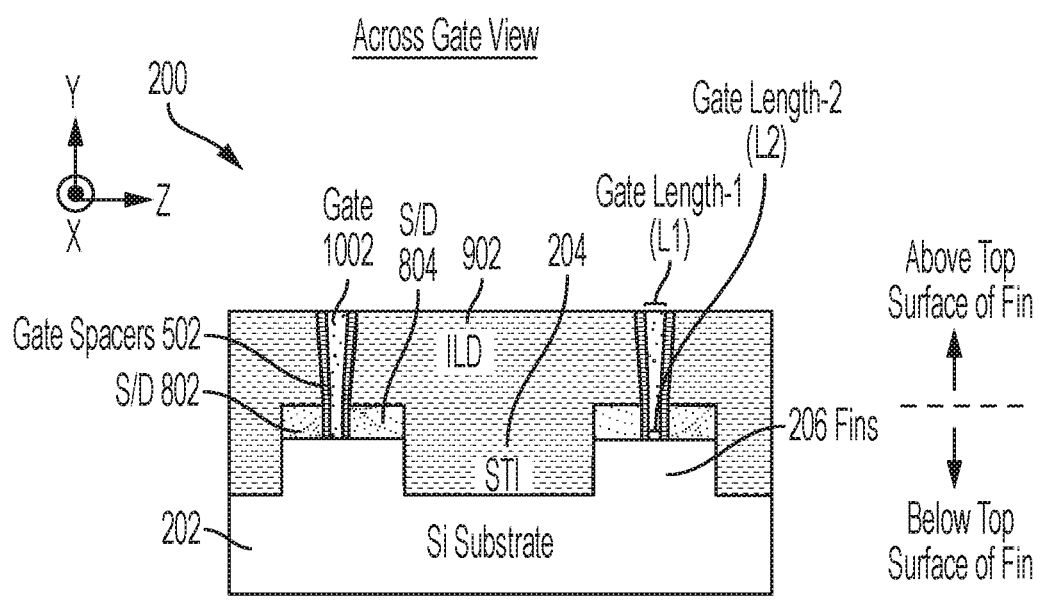

As best shown in FIG. 4C, the gate trenches 402 are etched using a two-step etch that forms lower gate trench regions 402A (using a first etch) and upper gate trench region s 402B (using a second etch). To form the upper gate trench regions 402B, the first etch is an anisotropic etch configured to initially etch the gate trenches 402 in directions that are at an angle with respect to the major surface 202A of the substrate 202, which results in sidewalls of the upper gate trenches being substantially planar and an at an angle with respect to the major surface 202A of the substrate 202. In accordance with aspects of the invention, the upper gate trench region 402B is above the fins 206, and more specifically is above the portion of the fins 206 where source or drain (S/D) regions 802, 804 (shown in FIG. 8) will be formed. After the upper gate trench regions 402B are formed, the first anisotropic etch configuration is switched, and a second different anisotropic etch applied to the structure 200 in order to etch the dummy fill 302 in a direction that is substantially planar and substantially perpendicular (i.e., at an angle) with respect to the major surface 202A of the substrate 202. The second anisotropic etch is selective to the dummy fill 302 over the high-k liner 252 so the second etch stops on the liner 252. In accordance with aspects of the invention, the liner 252 protects the active regions of the fins 202 and the STI regions 204 from being damaged by the second anisotropic etch. The second etch results in the formation of a Y-shaped profile for the gate trenches 402 as shown in the cross-sectional, across-the-gate-between-the-fins view of FIG. 4C. The gate trench 402 surround a central region of the active regions of the fins 206 in substantially the same manner as the Y-shaped gates 1002, 1002A, which are shown in FIG. 10 and described in greater detail subsequently in this detailed description.

Figures 5A, 5B:
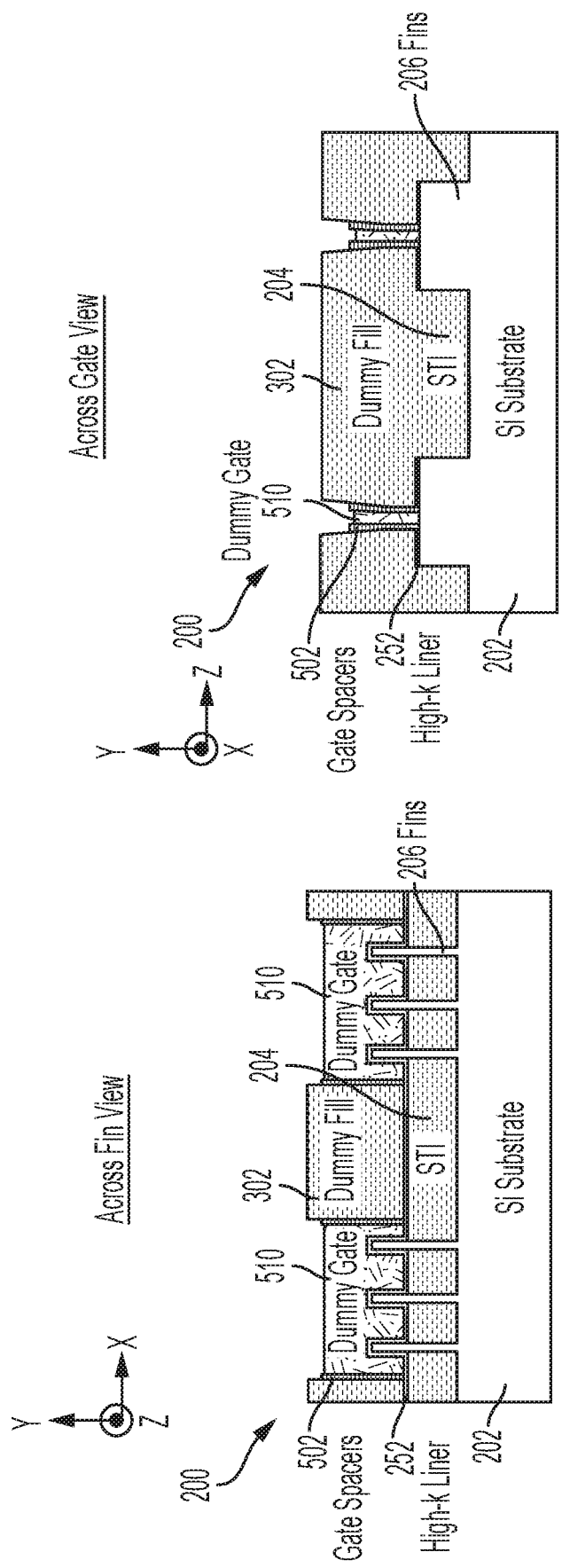
FIG. 5A depicts a cross-sectional view of the representative section of the IC after fabrication operations according to embodiments of the invention.
FIG. 5B depicts another cross-sectional view (in perpendicular orientation with respect to the view in FIG. 5A) of the representative section of the IC after the fabrication operations depicted in FIG. 5A.

FIG. 5A depicts a cross-sectional, across-the-fin view of the structure 200 after fabrication operations according to embodiments of the invention, and FIG. 5B depicts a cross-sectional, across-the-gate view of the structure 200 after the same fabrication operations depicted in FIG. 5A. Known fabrication operations have been used to form gate spacers 502 and dummy gates 510 in the gate trenches 402 (shown in FIGS. 4A, 4B, 4C). In aspects of the invention, the gate spacers 502 can be formed by conformally depositing (e.g., using ALD) a layer (not shown) of gate spacer material over the structure 200 and into the trenches 402 (shown in FIGS. 4A, 4B, 4C). The layer of gate spacer material is etched (e.g., using a spacer pull-down process) to form the gate spacers 502. In some aspects of the invention, the gate spacers 502 can also be formed using a sidewall image transfer (SIT) spacer formation process, which includes spacer material deposition followed by directional RIE of the deposited spacer material. As shown in FIGS. 5A, 5B, in embodiments of the invention, the gate spacers 502 are pulled down to a level that is below the top surface of the dummy fill 302. In aspects of the invention, the gate spacers 502 can be formed from any suitable dielectric, including nitride-based dielectrics such as SiBCN.

Referring still to FIGS. 5A and 5B, the dummy gates 510 can be formed by depositing dummy gate material (not shown) (e.g., amorphous silicon (aSi)) within the gate trenches 402 (shown in FIGS. 4A, 4B, 4C) and along the gate spacers 502 using any suitable deposition process. A planarization process (e.g., CMP) is applied to the dummy gate material to bring the dummy gate material to the same level as a top surface of the dummy fill 302. The dummy gate material is then recessed to form the dummy gates 510 and bring the dummy gates 510 a level below the top surfaces of the dummy fill 302 and the gate spacers 502.

Figures 6A, 6B:
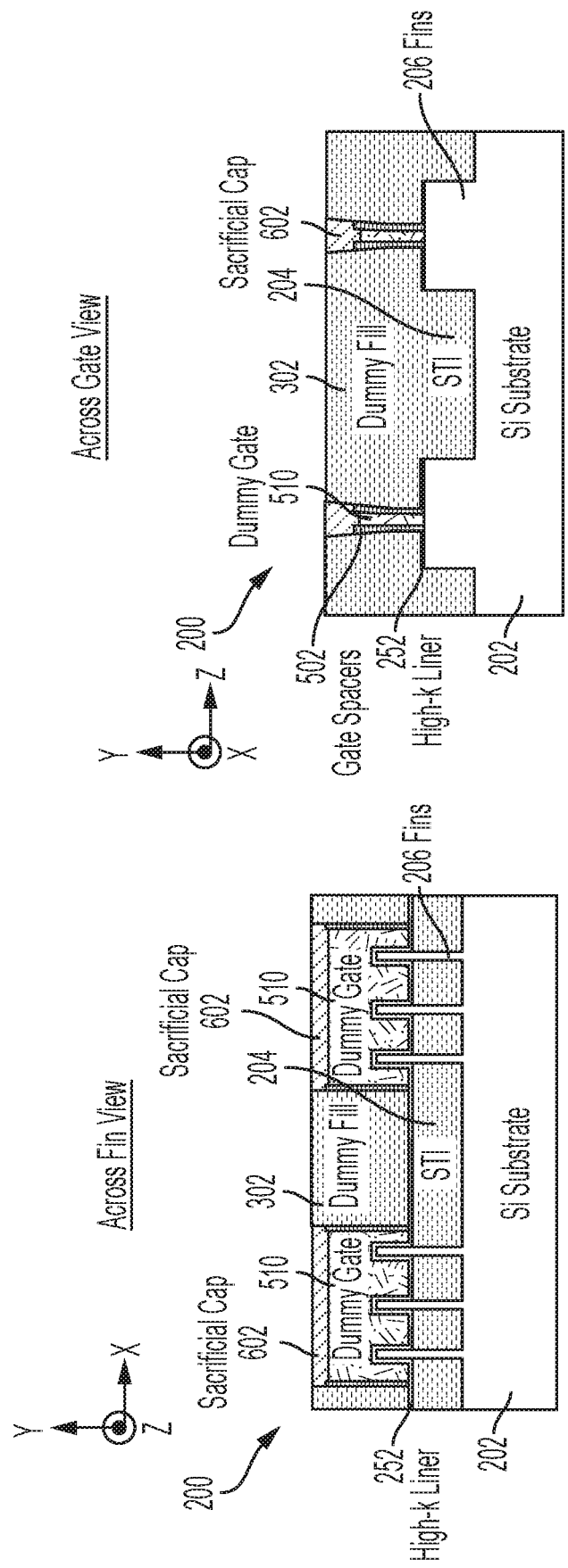
FIG. 6A depicts a cross-sectional view of the representative section of the IC after fabrication operations according to embodiments of the invention.
FIG. 6B depicts another cross-sectional view (in perpendicular orientation with respect to the view in FIG. 6A) of the representative section of the IC after the fabrication operations depicted in FIG. 6A.

FIG. 6A depicts a cross-sectional, across-the-fin view of the structure 200 after fabrication operations according to embodiments of the invention, and FIG. 6B depicts a cross-sectional, across-the-gate view of the structure 200 after the same fabrication operations depicted in FIG. 6A. Known fabrication operations have been used to deposit a sacrificial gate cap material (not shown) over the dummy gates 510 and the top surface of the gates spacers 502. A planarization process (e.g., CMP) is applied to the sacrificial gate cap material to form the sacrificial gate caps 602 and to bring the sacrificial gate caps 602 to the same level as a top surface of the dummy fill 302. In embodiments of the invention, the sacrificial gate cap 602 can be any suitable dielectric, including, for example, a dielectric nitride such as SiN.

FIG. 7A depicts a cross-sectional, across-the-fin view of the structure 200 after fabrication operations according to embodiments of the invention, and FIG. 7B depicts a cross-sectional, across-the-gate view of the structure 200 after the same fabrication operations depicted in FIG. 7A. Known fabrication operations have been used to remove the dummy fill 302. In aspects of the invention, the dummy fill 302 can be removed using an isotropic RIE that is selective to the material of the dummy fill 302 over the material of the liner 252 and the material of the sacrificial gate cap 602. In accordance with aspects of the invention, the fins 206 and the STI 204 are protected by the liner 252, and the gate spacers 502 and the dummy gates 510 are protected by the sacrificial gate caps 602.

Figure 8:
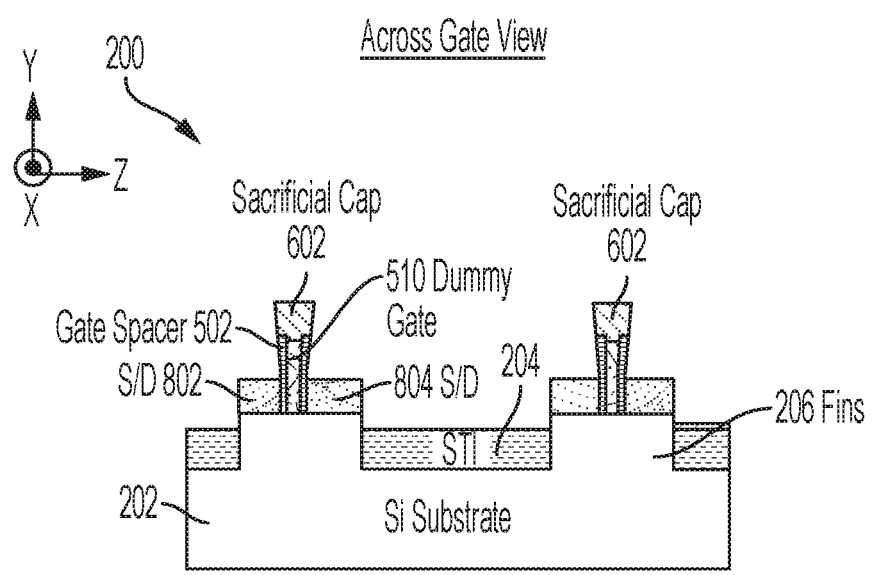
Figure 9:
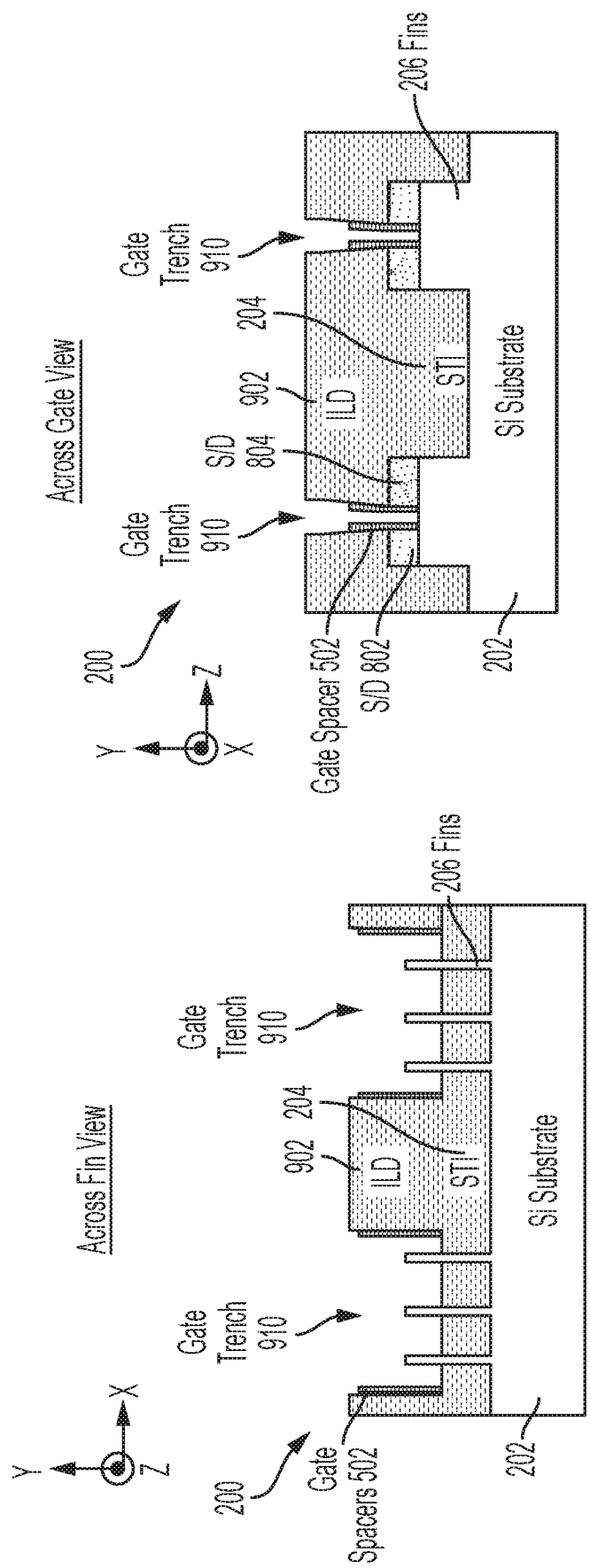

FIG. 8 depicts a cross-sectional, across-the-gate view of the structure 200 after fabrication operations according to embodiments of the invention. After the fabrication operations depicted in FIGS. 7A, 7B, known fabrication operations have been used to remove the exposed portions of the liner 252 to expose top surfaces of the end regions of the fins 206 and top surfaces of the STI regions 204. Known fabrication operations have also been used to form doped S/D regions 802, 804 in or over the portions of the fins 206 that are not covered by the dummy gate 510 and gate spacers 502. In aspects of the invention, the doped S/D regions 802, 804 can be formed in the fins 206 by injecting the appropriate dopants (n-type or p-type dopants) into the portions of the fins 206 that are not covered by the dummy gate 510 and gate spacers 502. In aspects of the invention, the doped S/D regions 802, 804 can be formed over the fins 206 by epitaxially growing the in-situ doped S/D regions 802, 804 (also known as raised S/D regions) on the portions of the fins 206 that are not covered by the dummy gate 510 and gate spacers 502.

FIG. 9A depicts a cross-sectional, across-the-fin view of the structure 200 after fabrication operations according to embodiments of the invention, and FIG. 9B depicts a cross-sectional, across-the-gate view of the structure 200 after the same fabrication operations depicted in FIG. 9A. Known fabrication operations have been used to deposit an ILD region 902 over the structure 200. In embodiments of the invention, the ILD region 902 can be any suitable dielectric, including, for example, an oxide. As part of a RMG process, known fabrication operations have also been used to remove the sacrificial gate cap 602, the dummy gate 510, and portions of the liner 252 that remain over the active regions of the fins 206. The sacrificial gate cap 602, the dummy gate 510, and the liner 252 can be removed by an etching process, e.g., RIE or chemical oxide removal (COR), thereby forming gate trenches 910 in the ILD 902. A planarization process (e.g., CMP) is applied to the ILD region 902 to planarize a top surface of the ILD region 902, and to bring the top surface of the ILD 902 level with the top surface of the gate spacers 502.

FIG. 10 depicts a cross-sectional, across-the-fin view of the structure 200 after fabrication operations according to embodiments of the invention. More specifically, FIG. 10 depicts the remaining operations of a RMG process applied to the structure 200 where the gate spacers 502 have been formed in a Y-shaped configuration in which a lower region of the gate spacers 502 has spacer wall segments that are below a top surface of the fin 206 and substantially perpendicular with respect to the major surface 202A of the substrate 202, and in which an upper region of the gate spacers 502 has spacer wall segments that are above the top surface of the fin 206 and tapered outward such that the spacer wall segments are at an angle (i.e., non-perpendicular and non-parallel) with respect to the major surface 202A of the substrate 202. In aspects of the invention, the gate spacers 502 are formed such that the sidewalls of the spacer wall segments are substantially planar.

Because the gate 1002 is formed after the gate spacers 502, the inner sidewalls of the gate spacers 502 define the outer sidewalls of the gate 1002. Hence, the contours of the outer sidewalls of the gate 1002 follow the contours of the inner sidewalls of the gate spacers 502.

Referring still to FIG. 10, in the RMG process, known fabrication operations have been used to form the gate 1002 in the gate trenches 910 (shown in FIGS. 9A, 9B). In aspects of the invention, the gate 1002 can include a gate dielectric material and gate metal. For example, a high-k dielectric material, e.g., hafnium based material, can be deposited in the gate trench 910 to form the gate dielectric. A metal liner, e.g., a work-function metal, and a gate metal can then be deposited on the dielectric material to complete the gate 1002. In embodiments of the invention, the metal liner can be, for example, TiN or TaN, and the gate metal can be aluminum or tungsten. In accordance with aspects of the invention, the gate length (Lgate) is the dimension L2. However, because the portion of the gate 1002 that is above the top surface of the fin 206 is tapered outward, the dimension L1 along the top surface of the gate 1002 is greater than L2. L1 being greater than L2 provides an increased top surface area for forming the gate contact on the top surface of the gate 1002 without increasing the Lgate dimension L2. A planarization process (e.g., CMP) is applied after formation of the gate 1002 to planarize the structure 200.

FIG. 11A depicts a cross-sectional, across-the-fin view of the structure 200 after fabrication operations according to embodiments of the invention, and FIG. 11B depicts a cross-sectional, across-the-gate view of the structure 200 after the same fabrication operations depicted in FIG. 11A. The fabrication operations depicted in FIGS. 11A, 11B can also be applied to the structure 200A shown in FIG. 10. Known fabrication operations have been used to deposit an ILD region 1102 over the structure 200. In embodiments of the invention, the ILD region 1102 can be any suitable dielectric, including, for example, an oxide. As part of a contact formation process, known fabrication operations have also been used to form gate contact trenches (not shown) and S/D contact trenches (not shown) in the ILD 1102. Gate contacts 1110 and S/D contacts 1114 are formed in the gate contact trenches and the S/D contact trenches, respectively. In aspects of the invention, the contacts 1110, 1114 can take a variety of forms and can include a variety of sub-elements, including, for example, metal plugs and self-aligned cap areas. In aspects of the invention, the contacts 1110, 1114 can include a liner (not shown). The liner can be deposited using any deposition technique suitable for the material that has been selected to form the liner. The liner serves multiple functions, including, for example, functioning as a barrier to prevent metals in the contacts 1110, 1114 from migrating out of the contacts 1110, 1114. In embodiments of the invention, the liner can be formed from a variety of materials, including, but not limited to TiN. The contacts 1110, 1114 can be deposited using any suitable deposition process, including, for example, a chemical/electroplating process. The contacts can be formed from any suitable conductive material, including, for example, copper and cobalt. In accordance with aspects of the invention, as best shown in FIG. 11A, a portion of the liner 252 remains in the structure 200 and is positioned under the gate spacers 252. A planarization process (e.g., CMP) is applied to the structure 200 to planarize a top surface of the ILD region 1102, top surfaces of the gate contacts 1110, and top surfaces of the S/D contacts 1114.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," "slightly less than," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be practically acted upon (e.g. etched) and the second element will not be practically acted upon (e.g. will not be etched and can act as an etch stop).

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming an integrated circuit (IC) structure, the method comprising:
   forming a fin over a major surface of a substrate;
   wherein the fin comprises an active fin region having a top fin surface and a fin sidewall;
   wherein the top fin surface is substantially parallel with respect to the major surface of the substrate;
   wherein the fin sidewall is substantially perpendicular with respect to the major surface of the substrate;
   forming a gate over and around a central portion of the fin, the gate having a bottom gate region and a top gate region;
   wherein the bottom gate region is substantially below the top fin surface and includes a bottom gate region sidewall that is substantially parallel with respect to the fin sidewall and substantially perpendicular with respect to the major surface of the substrate; and
   wherein the top gate region is substantially above the top fin surface and includes a top gate region sidewall that is substantially planar, substantially non-parallel with respect to the fin sidewall, and substantially non-parallel with respect to the major surface of the substrate.

2. The method of claim 1, wherein forming the gate comprises:
   forming a gate trench over and around the central portion of the fin, the gate trench comprising a bottom gate trench and a top gate trench;
   wherein the bottom gate trench is substantially below the top fin surface and comprises a bottom gate trench sidewall that is substantially parallel with respect to the fin sidewall and substantially perpendicular with respect to the major surface of the substrate;
   wherein the top gate trench is substantially above the top fin surface and comprises a top gate trench sidewall that is substantially planar, substantially non-parallel with respect to the fin sidewall, and substantially non-parallel with respect to the major surface of the substrate; and forming the gate within the gate trench;

wherein the bottom gate trench defines the bottom gate region to be substantially below the top fin surface and to include the bottom gate region sidewall that is substantially parallel with respect to the fin sidewall and substantially perpendicular with respect to the major surface of the substrate; and wherein the top gate trench defines the top gate region to be substantially above the top fin surface and to include the top gate region sidewall that is substantially planar, substantially non-parallel with respect to the fin sidewall, and substantially non-parallel with respect to the major surface of the substrate.

3. The method of claim 2, wherein forming the gate within the gate trench comprises:

forming a dummy gate within the gate trench; and replacing the dummy gate with a conductive material.

4. The method of claim 3, wherein forming the gate trench comprises:

depositing a dummy fill material over the active region of the fin;

forming a precursor gate trench in the dummy fill material; and forming a gate spacer within a portion of the precursor gate trench.

5. The method of claim 4 wherein:

the precursor gate trench comprises a bottom precursor gate trench and a top precursor gate trench;

the bottom precursor gate trench is substantially below the top fin surface;

the top precursor gate trench is substantially above the top fin surface; and the gate spacer comprises a top gate spacer region and a bottom gate spacer region.

6. The method of claim 5, wherein forming the gate trench further comprises:

depositing the bottom gate spacer region on a sidewall of the bottom precursor gate trench such that a sidewall of the bottom gate spacer region is exposed;

depositing the top gate spacer region on a sidewall of the top precursor gate trench such that a sidewall of the top gate spacer region is exposed;

wherein the bottom gate trench sidewall comprises the exposed sidewall of the bottom gate spacer region; and wherein the top gate trench sidewall comprises the exposed sidewall of the top gate spacer region.

7. The method of claim 6, wherein forming the gate within the gate trench comprises:

forming a dummy gate within the gate trench;

removing the dummy fill material; and replacing the dummy gate with a conductive material.

8. The method of claim 7, wherein forming dummy gate is subsequent to forming the gate spacer.

9. A method of forming an integrated circuit (IC) structure, the method comprising:

forming a fin over a major surface of a substrate;

wherein the fin comprises an active fin region having a top fin surface and a fin sidewall;

wherein the top fin surface is substantially parallel with respect to the major surface of the substrate;

wherein the fin sidewall is substantially perpendicular with respect to the major surface of the substrate;

forming a gate over and around a central portion of the fin, the gate having a bottom gate region and a top gate region;

wherein the bottom gate region is substantially below the top fin surface; and wherein the top gate region is substantially above the top fin surface and includes a top gate region sidewall that is substantially planar, substantially non-parallel with respect to the fin sidewall, and substantially non-parallel with respect to the major surface of the substrate.

10. The method of claim 9, wherein forming the gate comprises:

forming a gate trench over and around the central portion of the fin, the gate trench comprising a bottom gate trench and a top gate trench;

wherein the bottom gate trench is substantially below the top fin surface and comprises a bottom gate trench sidewall that is substantially parallel with respect to the fin sidewall and substantially perpendicular with respect to the major surface of the substrate;

wherein the top gate trench is substantially above the top fin surface; and forming the gate within the gate trench;

wherein the bottom gate trench defines the bottom gate region to be substantially below the top fin surface and to include the bottom gate region sidewall that is substantially parallel with respect to the fin sidewall and substantially perpendicular with respect to the major surface of the substrate; and wherein the top gate trench and the top gate trench sidewall define the top gate region to be substantially above the top fin surface and to include the top gate region sidewall that is substantially planar, substantially non-parallel with respect to the fin sidewall, and substantially non-parallel with respect to the major surface of the substrate.

11. The method of claim 10, wherein forming the gate further comprises:

forming a dummy gate within the gate trench; and replacing the dummy gate with a conductive material.

12. The method of claim 10, wherein forming the gate trench further comprises:

depositing a dummy fill material over the active region of the fin;

forming a precursor gate trench in the dummy fill material; and forming a gate spacer within a portion of the precursor gate trench.

13. The method of claim 12 wherein:

the precursor gate trench comprises a bottom precursor gate trench and a top precursor gate trench;

the bottom precursor gate trench is substantially below the top fin surface;

the top precursor gate trench is substantially above the top fin surface; and the gate spacer comprises a top gate spacer region and a bottom gate spacer region.

14. The method of claim 13, wherein forming the gate trench further comprises:

depositing the bottom gate spacer region on a sidewall of the bottom precursor gate trench such that a sidewall of the bottom gate spacer region is exposed;

depositing the top gate spacer region on a sidewall of the top precursor gate trench such that a sidewall of the top gate spacer region is exposed;

wherein the bottom gate trench sidewall comprises the exposed sidewall of the bottom gate spacer region; and wherein the top gate trench sidewall comprises the exposed sidewall of the top gate spacer region.

15. The method of claim 14, wherein forming the gate further comprises:
    forming a dummy gate within the gate trench;
    removing the dummy fill material; and
    replacing the dummy gate with a conductive gate material.

16. The method of claim 15, wherein forming the dummy gate is subsequent to forming the gate spacer.

17. An integrated circuit (IC) structure comprising:
    a fin formed over a major surface of a substrate;
    wherein the fin comprises an active fin region having a top fin surface and a fin sidewall;
    wherein the top fin surface is substantially parallel with respect to the major surface of the substrate;
    wherein the fin sidewall is substantially perpendicular with respect to the major surface of the substrate; and
    a gate formed over and around a central portion of the fin, the gate having a bottom gate region and a top gate region;
    wherein the bottom gate region is substantially below the top fin surface and includes a bottom gate region sidewall that is substantially parallel with respect to the fin sidewall and substantially perpendicular with respect to the major surface of the substrate; and
    wherein the top gate region is substantially above the top fin surface and includes a top gate region sidewall that is substantially planar, substantially non-parallel with respect to the fin sidewall, and substantially non-parallel with respect to the major surface of the substrate.

18. The structure of claim 17 further comprising a gate spacer adjacent to the gate, the gate spacer having a top gate spacer region and a bottom gate spacer region.

19. The structure of claim 18, wherein a sidewall of the bottom gate spacer region is adjacent to the bottom gate region sidewall, substantially parallel with respect to the fin sidewall, and substantially perpendicular with respect to the major surface of the substrate.

20. The structure of claim 19, wherein a sidewall of the top gate spacer region is adjacent to the top gate region sidewall, substantially non-parallel with respect to the fin sidewall, and substantially non-parallel with respect to the major surface of the substrate.

* * * * *